United States Patent [19]
Millard

[11] Patent Number: 6,143,979
[45] Date of Patent: *Nov. 7, 2000

[54] METHOD AND APPARATUS FOR ADDING SHIELDING FOR CIRCUIT PACKS

[75] Inventor: Robert A. Millard, Loveland, Colo.

[73] Assignee: Agilent Technologies, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/873,260

[22] Filed: Jun. 11, 1997

[51] Int. Cl.[7] ...................................................... H05K 9/00
[52] U.S. Cl. .................................. 174/35 GC; 174/35 R; 361/816; 361/796; 361/800; 361/802
[58] Field of Search ............................. 174/35 R, 35 GC; 361/800, 816, 796, 818, 741, 756, 802, 799

[56] References Cited

U.S. PATENT DOCUMENTS

| | | | |
|---|---|---|---|
| 4,860,163 | 8/1989 | Sarath | 361/695 |
| 5,467,254 | 11/1995 | Brusati et al. | 361/799 |

FOREIGN PATENT DOCUMENTS

| | | | |
|---|---|---|---|
| 01030295 | 2/1989 | Japan | H05K 7/14 |
| 08250886 | 9/1996 | Japan | H05K 9/00 |

OTHER PUBLICATIONS

HP 75000 Family of VXI Components, Systems, and Services 1996 Source Book, Hewlett–Packard Company, Palo Alto, CA; Cover sheet and pp. 5.01–5.20 (no month).

HP75000 Family of VXI Components, Systems, and Services, 1996 Source Book, Hewlett–Packard Company, Palo Alto, CA; p. 12.0 (no month).

"VMEbus Extensions for Instrumentation VXI bus. Overview of VXIbus Specifications VXI–O" Revision 1.0, May 22, 1992; VXI Consortium.

*Primary Examiner*—Dean A. Reichard
*Assistant Examiner*—Hung V Ngo

[57] ABSTRACT

A method and apparatus for adding shielding for electronic circuit packs. The invention includes a circuit pack cage, which has a first pair of parallel longitudinal circuit pack slots for receiving the circuit packs and further has a first longitudinal shield slot disposed between first pair of circuit pack slots for receiving a conductive sheet member. At least one conductive resilient member is disposed in the first shield slot in electrical coupling with a conductive chassis. Upon sliding the conductive sheet member between the pair of circuit packs and into the shield slot, the resilient member flexibly engages the conductive sheet member and electrically couples the conductive sheet member with the conductive chassis.

11 Claims, 6 Drawing Sheets

METHOD AND APPARATUS FOR ADDING SHIELDING FOR CIRCUIT PACKS

FIELD OF THE INVENTION

The invention generally relates to shielding electromagnetic radiation and more particularly relates to adding shielding for electronic circuit packs.

BACKGROUND OF THE INVENTION

Various schemes for shielding circuit packs are known in the prior art. Shielding is especially important for circuit packs that are VXI (Versabus eXtensions for Instrumentation) instrumentation modules, since electromagnetic radiation from adjacent modules would corrupt sensitive measurement made by the VXI instrumentation modules. One such scheme relies on a complex assembly of shielding and threaded grounding screws for keeping the shielding grounded and in place.

While such schemes provide some advantageous some limitations still remain. As circuit packs or added or rearranged, tedious labor is needed to carefully extract, insert, or adjust the grounding screws. It has been observed in some instances that the grounding screws were not properly arranged in contact with the shielding, which allowed the shielding to assume a floating electrical potential. This in turn resulted in poor electromagnetic isolation between circuit packs.

What is needed is a simplified, efficient, flexible, and convenient method and apparatus for adding shielding for circuit packs.

SUMMARY OF THE INVENTION

The present invention provides a simplified, efficient, flexible, and convenient method and apparatus for adding shielding for electronic circuit packs.

Briefly and in general terms the invention includes a circuit pack cage, which has a first pair of parallel longitudinal circuit pack slots for receiving the circuit packs and further has a first longitudinal shield slot disposed between first pair of circuit pack slots for receiving a conductive sheet member. At least one conductive resilient member is disposed in the first shield slot in electrical coupling with a conductive chassis. Upon sliding the conductive sheet member between the pair of circuit packs and into the shield slot, the resilient member flexibly engages the conductive sheet member and electrically couples the conductive sheet member with the conductive chassis.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1A:
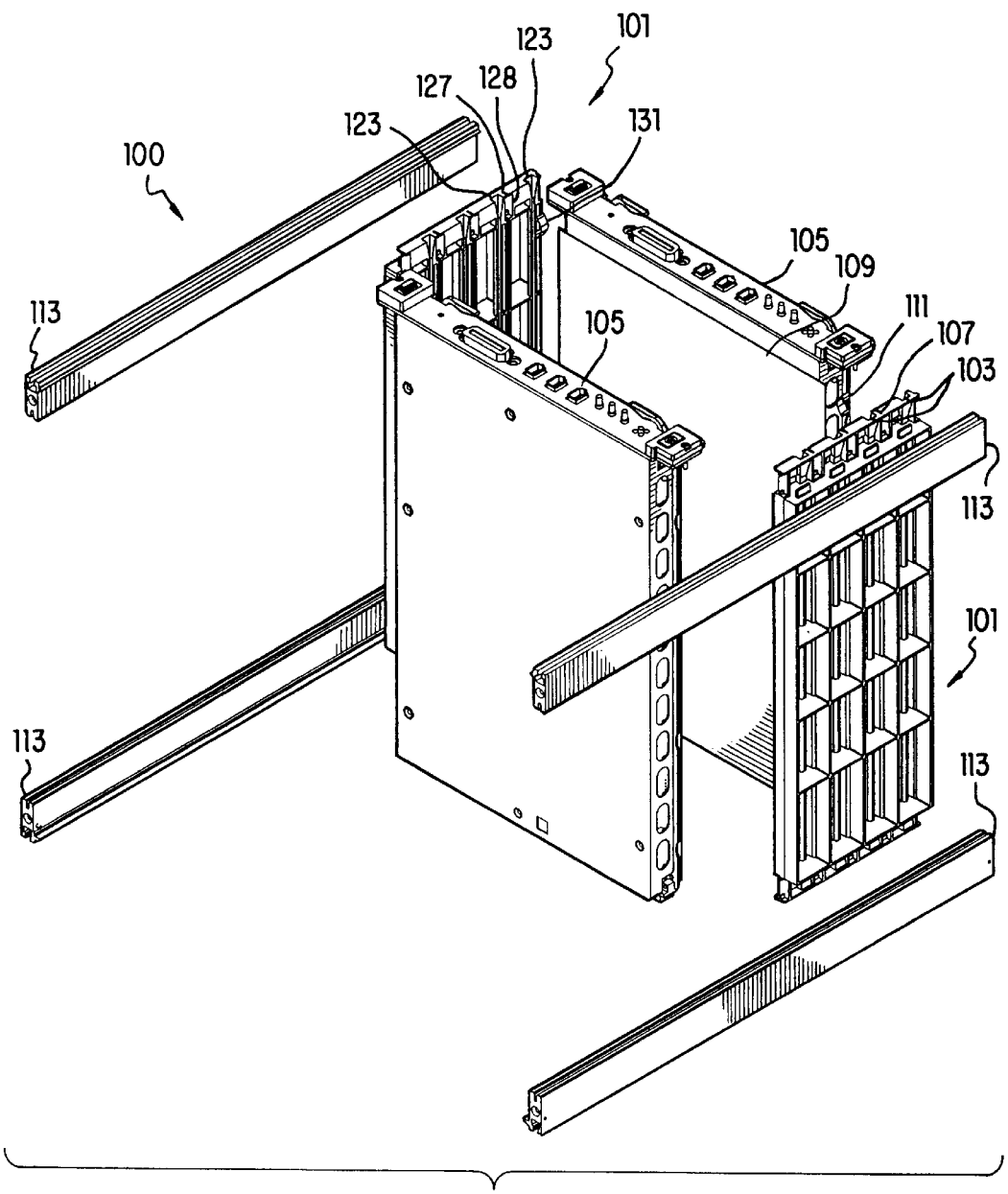
FIG. 1A is an exploded perspective view of a preferred embodiment of the invention.

FIG. 1A is an exploded perspective view of a preferred embodiment of the apparatus of the invention 100. As shown, a circuit pack cage 101 has a first pair of parallel longitudinal circuit pack slots 103 for receiving a pair of electronic circuit packs 105. In the preferred embodiment, the circuit packs are VXI (Versabus eXtensions for Instrumentation) instrumentation modules. The efficient shielding provided by the present invention is particularly advantageous for shielding VXI instrumentation modules, since electromagnetic radiation from adjacent modules would corrupt sensitive measurements made by the VXI instrumentation modules. The flexibility in adding the shielding of the invention is particularly advantageous to VXI instrumentation modules, since VXI modules may be frequently rearranged into different configurations, depending on various instrumentation requirements.

As shown in FIG. 1A, the circuit pack cage further has a first longitudinal shield slot 107 disposed between the first pair of circuit pack slots 103 for receiving a conductive sheet member 109, preferably a sheet of aluminum. At least one conductive resilient member 111 is disposed in the first shield slot in electrical coupling with a conductive chassis 113. In the preferred the preferred embodiment two conductive resilient members 111 are disposed in the first shield slot. Preferably, an expanded pocket for retaining the resilient member extends into the shield slot 107. For the sake of simplicity, conductive cross members coupled with the conductive chassis 113 are not shown in the figures.

Upon sliding the conductive sheet member 109 between the pair of circuit packs 105 and into the shield slot 107, the resilient member 111 flexibly engages the conductive sheet member 109 and electrically couples the conductive sheet member 109 with the conductive chassis 113.

In the preferred embodiment the conductive resilient member features a substantially U shaped cross section. As shown, the conductive resilient member has a central region feature for flexibly engaging an edge of the conductive sheet member and also features a pair of arms extending outwardly from the central region for engaging the conductive chassis. It should be understood that these features contribute to advantageously retaining the resilient member in the shield slot and to ease of sliding the conductive sheet member into place.

As shown in FIG. 1A, in the preferred embodiment, the circuit pack cage further has a second pair of parallel longitudinal circuit pack slots 123, opposing the first pair of circuit pack slots 103 and similar thereto, for receiving the pair of circuit packs 105 and spatially arranging the circuit packs in parallel. The circuit pack cage further has a second longitudinal shield slot 127, opposing the first longitudinal shield slot 107 and similar thereto. As shown, another expanded pocket 128 for retaining other resilient member 131 extends into the second shield slot 127. As shown, the second shield slot 127 is disposed between second pair of circuit pack slots 123 for receiving the conductive sheet member 109. Said another conductive resilient member 131 is disposed in the pocket 128 of the second shield slot 127 and arranged for electrically coupling the conductive sheet member 109 with the conductive chassis 113.

Figure 1B:
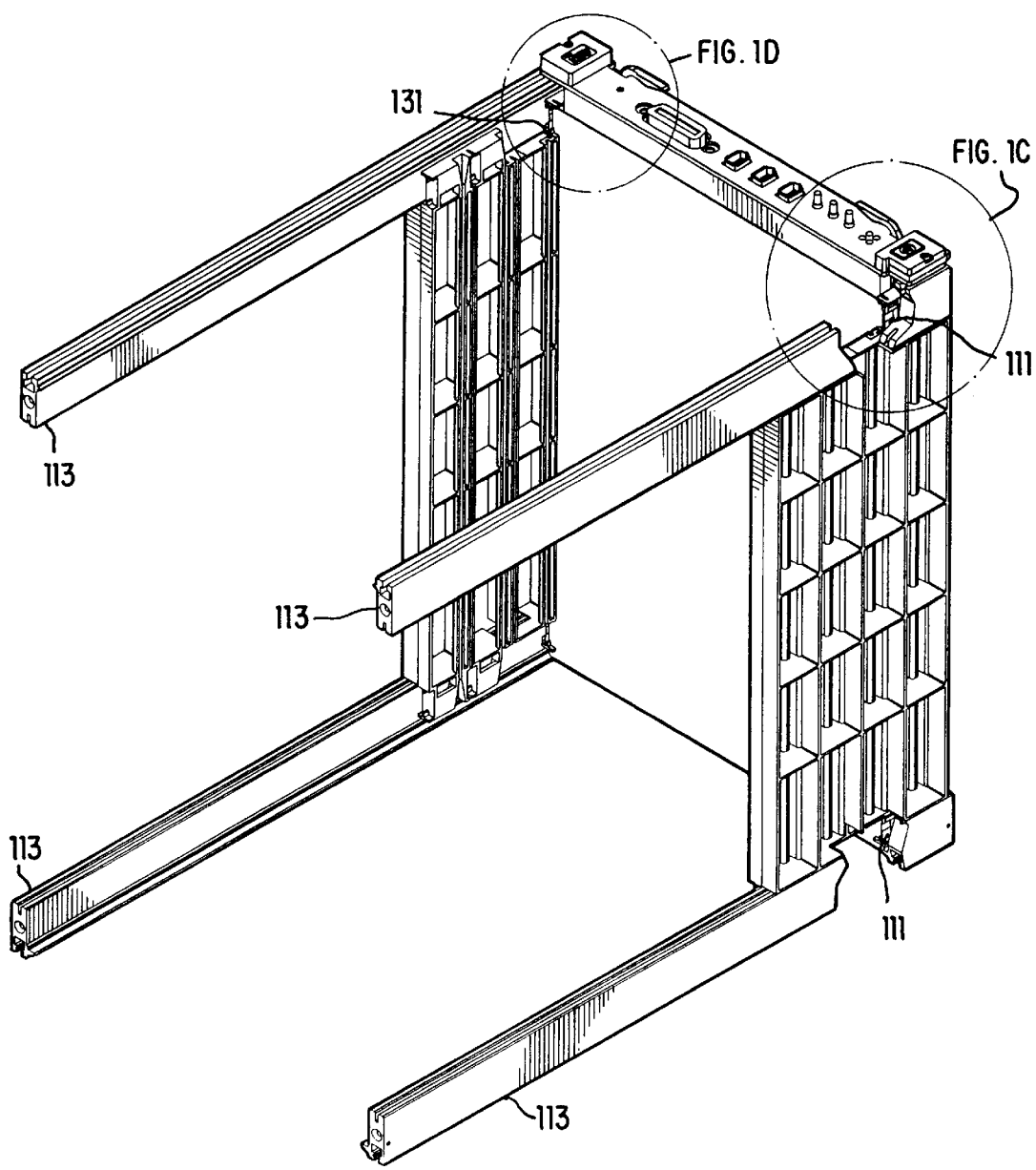
FIG. 1B is a cut away perspective view of the preferred embodiment of the invention.
Figure 1C:
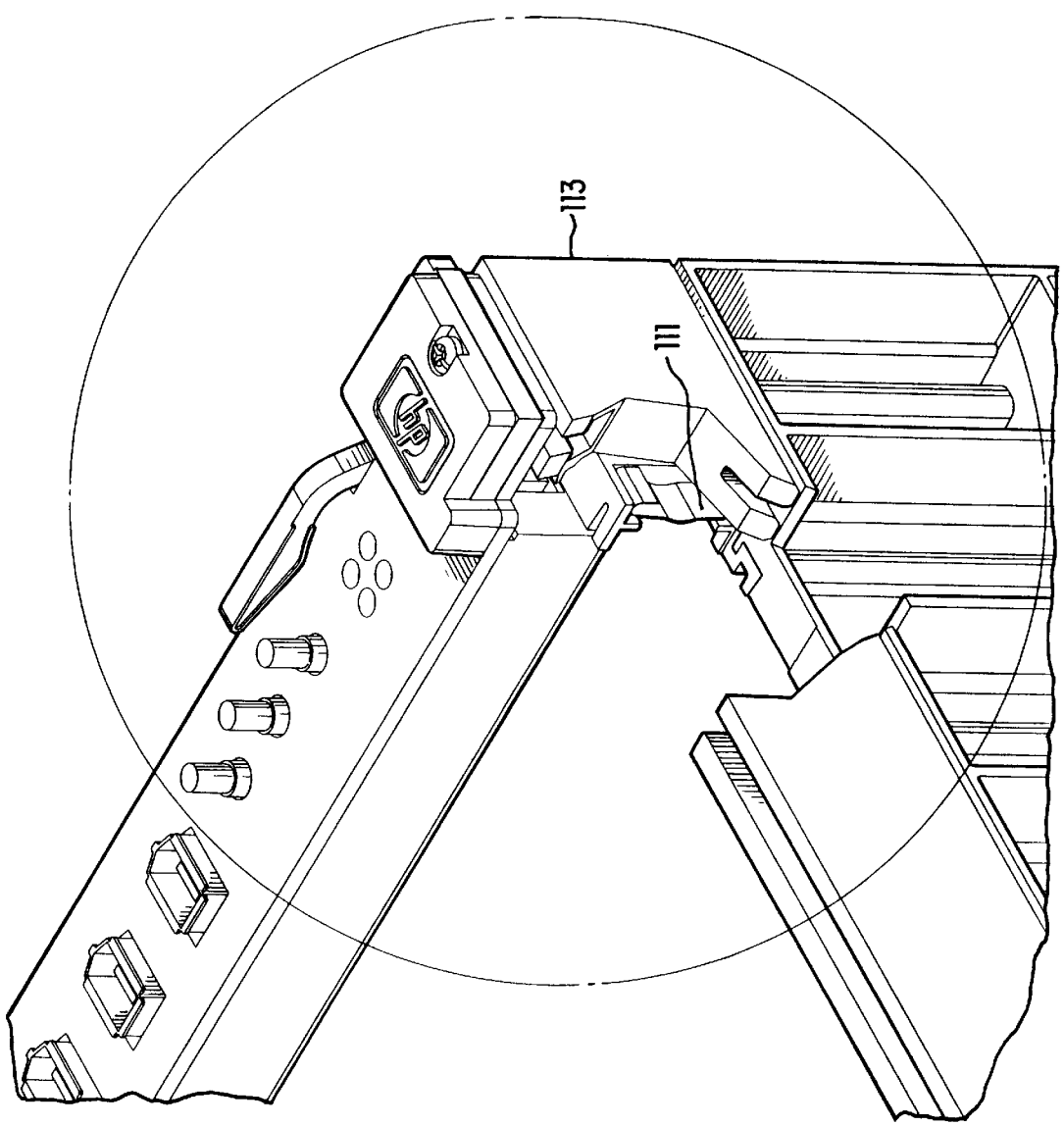
FIGS. 1C and 1D are detailed views of FIG. 1B.
Figure 1D:
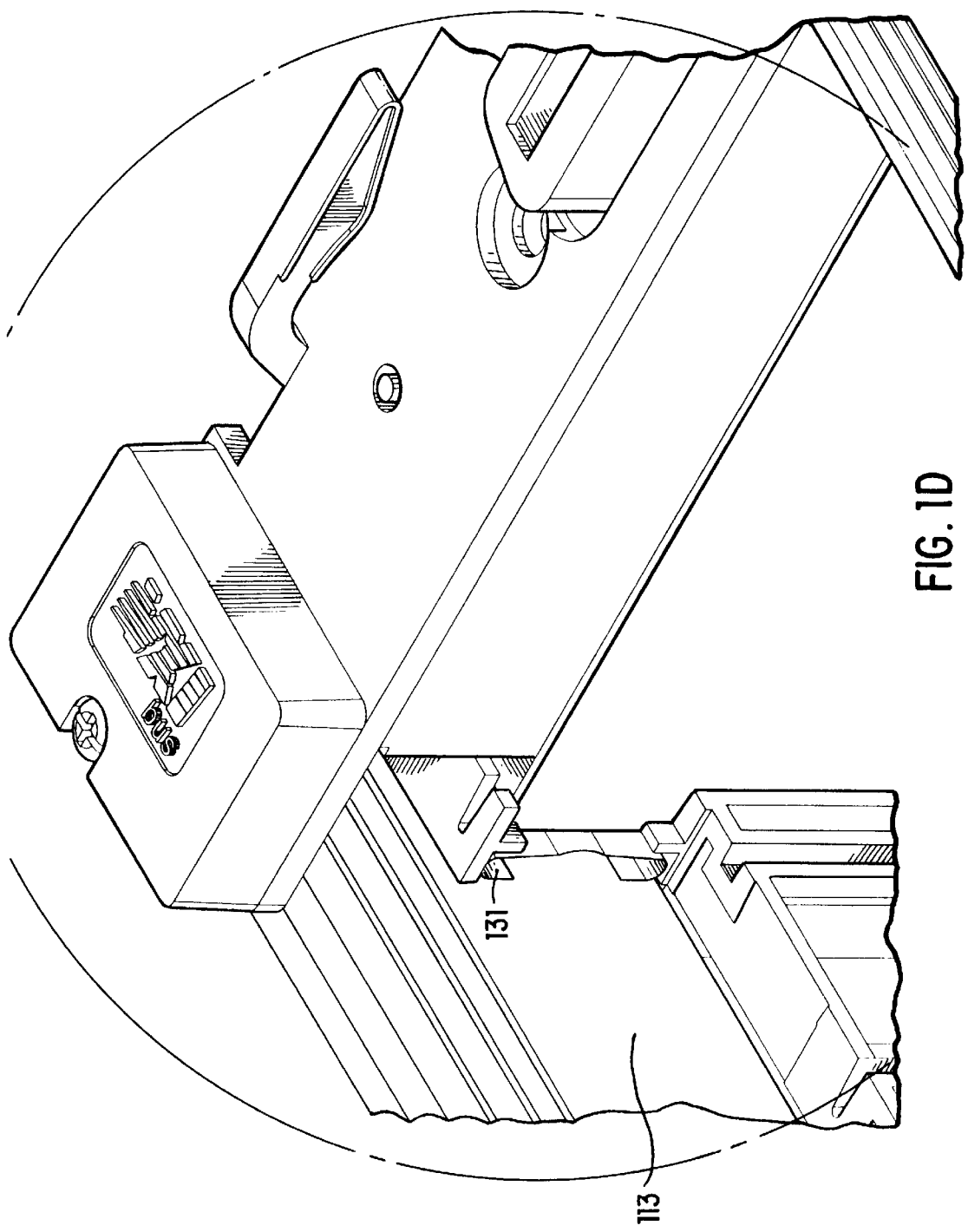

FIG. 1B is a cut away perspective view of the apparatus of the invention. One of the circuit packs and portions of the conductive chassis and card cage are shown cut away to reveal resilient members 111,113 disposed in pockets of the shield slots and flexibly engaging the conductive sheet member, as further shown in detailed views in FIG. 1C and FIG. 1D.

Figure 1F:
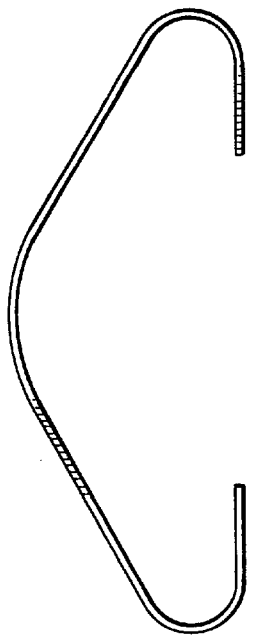
FIGS. 1E and 1F are further detailed views of the conductive resilient member employed in conjunction with the preferred embodiment of the invention.
Figure 1E:
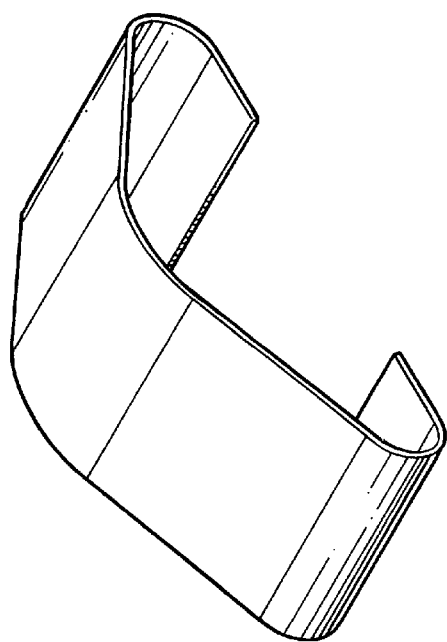

FIGS. 1E and 1F are further detailed views of the conductive resilient member employed in conjunction with the preferred embodiment of the invention. As discussed previously herein and as shown in the figures, the conductive resilient member features a substantially U shaped cross section. In the preferred embodiment, the conductive resilient member is fabricated from a beryllium copper alloy plated with tin.

Figure 1G:
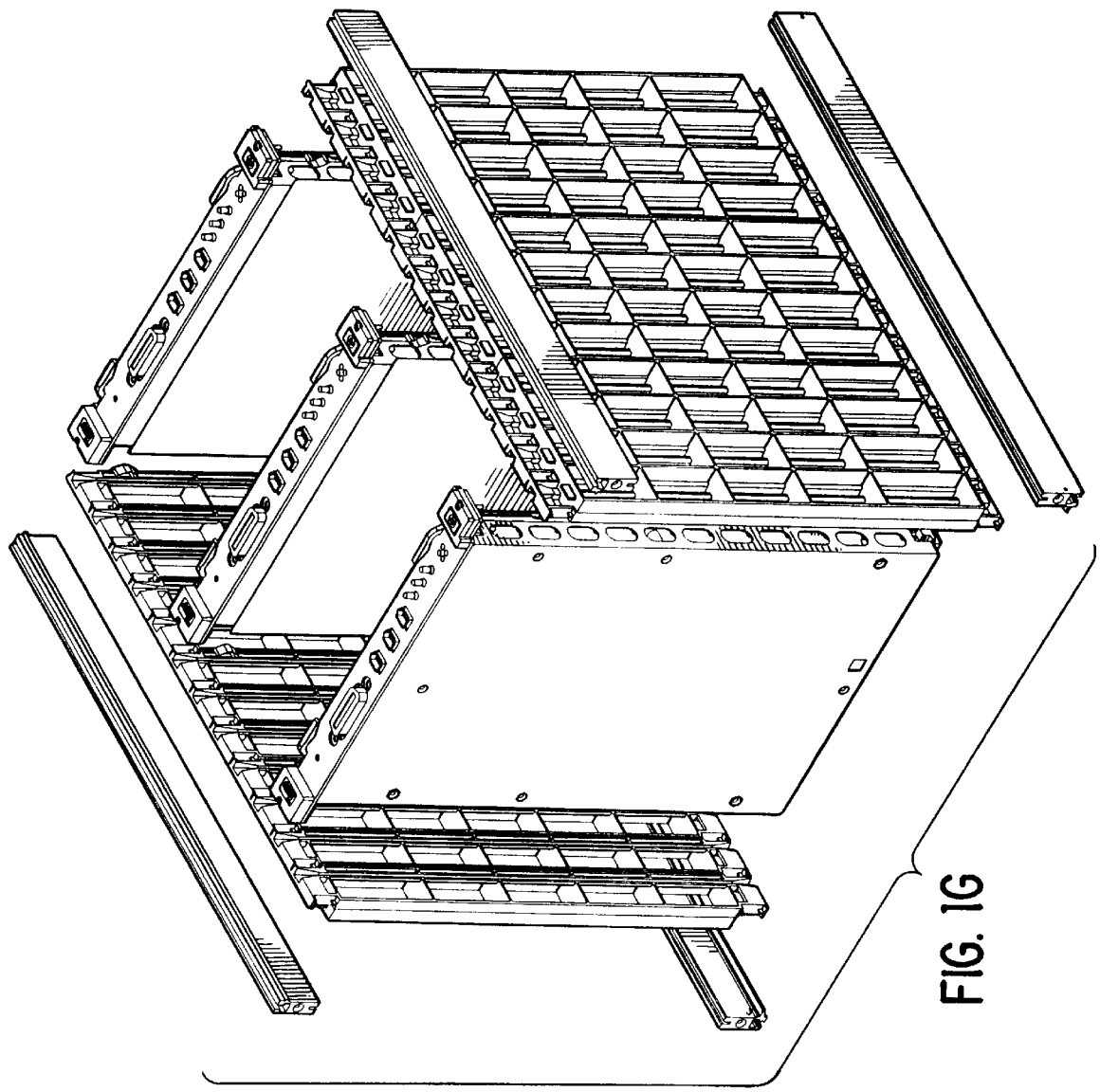
FIG. 1G shows another exploded perspective view of the preferred embodiment of the invention.

Of course the principles of the invention are not strictly limited to application to just a pair of circuit packs. The principles of the invention are advantageously applied to electromagnetically shielding a plurality of electronic circuit packs from one another. FIG. 1G shows another exploded perspective view of the preferred embodiment of the invention. As shown, a plurality of conductive sheet members are used in conjunction with a circuit pack cage having a first set of parallel longitudinal circuit pack slots for receiving the circuit packs and for spatially arranging the circuit packs in parallel with one another, and further having a first set of parallel longitudinal shield slots interdigitated with the first set of circuit pack slots for receiving the conductive sheet members and for arranging each conductive sheet member between a respective pair of the circuit packs. A first set of conductive resilient members are each disposed in a respective one of the first shield slots and are arranged for electrically coupling the respective conductive sheet member with the conductive chassis.

The circuit pack cage further has a second set of parallel longitudinal circuit pack slots, opposing the first set of circuit pack slots, for receiving the pair of circuit packs, and further has a second set of longitudinal shield slots, opposing the first set of longitudinal shield slots, and interdigitated between second set of circuit pack slots for receiving the conductive sheet members. As shown, a second set of conductive resilient members are each disposed in a respective one of the second set of shield slots and arranged for electrically coupling the respective conductive sheet member with the conductive chassis.

As discussed, the present invention provides a simplified, efficient, flexible, and convenient method and apparatus for adding shielding for electronic circuit packs. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. An apparatus for electromagnetically shielding a pair of electronic circuit packs from one another comprising:
   a conductive sheet member separate and distinct from the circuit packs;
   a circuit pack cage:
      having a first pair of parallel longitudinal circuit pack slots for receiving the pair of circuit packs and for spatially arranging the circuit packs in parallel with one another, wherein the circuit pack slots slideably engage the circuit packs, and
      further having a first longitudinal shield slot separate and distinct from the circuit pack slots and disposed between said first pair of circuit pack slots for receiving the conductive sheet member and for arranging the sheet member between the circuit packs, wherein the shield slot slideably engages the conductive sheet member;
   a conductive chassis mechanically coupled with the circuit pack cage for supporting the cage and the circuit packs; and
   at least one independent, separate, autonomous conductive resilient member disposed in the first shield slot and arranged for directly electrically coupling the conductive sheet member with the conductive chassis.

2. An apparatus as in claim 1 wherein the conductive resilient member has a substantially U shaped cross section.

3. An apparatus as in claim 2 wherein the conductive resilient member has a central region for flexibly engaging an edge of the conductive sheet member and a pair of arms extending outwardly from the central region for engaging the conductive chassis.

4. An apparatus as in claim 1 wherein:
   the circuit pack cage:
      further has a second pair of parallel longitudinal circuit pack slots, opposing the first pair of circuit pack slots, for receiving the pair of circuit packs, and
      further has a second longitudinal shield slot, opposing the first longitudinal shield slot and disposed between said second pair of circuit pack slots for receiving the conductive sheet member; and
   another conductive resilient member, which is disposed in the second shield slot and arranged for electrically coupling the conductive sheet member with the conductive chassis.

5. An apparatus as in claim 1 comprising said pair of electronic circuit packs, wherein the conductive sheet member, the circuit pack cage, and the conductive chassis are adapted and arranged for such electromagnetic shielding when said circuit packs are VXI Instrumentation modules.

6. An apparatus for electromagnetically shielding a plurality of electronic circuit packs from one another comprising:
   a plurality of conductive sheet members separate and distinct from the circuit packs;
   a circuit pack cage:
      having a first set of parallel longitudinal circuit pack slots for receiving the circuit packs and for spatially arranging the circuit packs in parallel with one another, and
      further having a first set of parallel longitudinal shield slots separate and distinct from the circuit pack slots and interdigitated with the first set of circuit pack slots for receiving the conductive sheet members and for arranging each conductive sheet member between a respective pair of circuit packs;
   a conductive chassis mechanically coupled with the circuit pack cage for supporting the cage and the circuit packs; and
   a first set of autonomous conductive resilient members each disposed in a respective one of the first shield slots and arranged for independently electrically coupling the respective conductive sheet member with the conductive chassis.

7. An apparatus as in claim 6 wherein each of the conductive resilient members has a substantially U shaped cross section.

8. An apparatus as in claim 7 wherein each of the conductive resilient members has a central region for flexibly engaging an edge of the conductive sheet member a pair of arms extending outwardly from the central region for engaging the conductive chassis.

9. An apparatus as in claim 6 wherein:
   the circuit pack cage:

further has a second set of parallel longitudinal circuit pack slots, opposing the first set of circuit pack slots, for receiving the pair of circuit packs, and further has a second set of longitudinal shield slots, opposing the first set of longitudinal shield slots, and interdigitated between the second set of circuit pack slots for receiving the conductive sheet members; and a second set of autonomous conductive resilient members, which are each disposed in a respective one of the second set of shield slots and arranged for electrically coupling the respective one of the conductive sheet members with the conductive chassis.

10. An apparatus as in claim 6 comprising said plurality of electronic circuit packs, wherein the plurality of conductive sheet members, the circuit pack cage, and the conductive chassis are adapted and arranged for such electromagnetic shielding when said circuit packs are VXI instrumentation modules.

11. A method for shielding a pair of electronic circuit packs from one another comprising the steps of:

providing a conductive sheet member separate and distinct from the circuit packs, a conductive chassis and a circuit pack cage, which as a first pair of parallel longitudinal circuit pack slots and further has a first longitudinal shield slot separate and distinct from the circuit pack slots and disposed between the first pair of circuit pack slots;

sliding the pair of circuit packs into the circuit pack slots so as to arrange the circuit packs in parallel with one another;

disposing at least one autonomous conductive resilient member in the first shield slot in independent electrical coupling with the conductive chassis; and sliding the conductive sheet member between the pair of circuit packs and into the shield slot so as to flexibly engage the autonomous conductive resilient member and electrically couple the conductive sheet member with the conductive chassis through the autonomous conductive resilient member.

* * * * *